(12) United States Patent
Anzai (10) Patent No.: US 6,516,446 B2
(45) Date of Patent: Feb. 4, 2003

(54) DESIGN SYSTEM FOR FLIP CHIP SEMICONDUCTOR DEVICE

(75) Inventor: Takahiro Anzai, Kanagawa (JP)

(73) Assignee: NEC Corporation, Tokyo (JP)

( * ) Notice: Subject to any disclaimer, the term of this patent is extended or adjusted under 35 U.S.C. 154(b) by 89 days.

(21) Appl. No.: 09/844,351

(22) Filed: Apr. 27, 2001

(65) Prior Publication Data

US 2001/0039642 A1 Nov. 8, 2001

(30) Foreign Application Priority Data

Apr. 28, 2000 (JP) .................................. 2000-129403

(51) Int. Cl.[7] .............................................. G01R 31/28
(52) U.S. Cl. ........................ 716/1; 716/2; 716/3; 716/4
(58) Field of Search .......................................... 716/1–5

(56) References Cited

U.S. PATENT DOCUMENTS 5,946,477 A * 8/1999 Ito ................................. 716/3
6,185,706 B1 * 2/2001 Sugasawara ................. 714/724
6,255,736 B1 * 7/2001 Kaneko ........................ 257/723

OTHER PUBLICATIONS

CAD Tools for Area–Distributed I/O Pad Packaging. Farbarik et al. IEEE Catalog No.: 97CB36039.*

* cited by examiner

Primary Examiner—Cuong Quang Nguyen
(74) Attorney, Agent, or Firm—Choate, Hall & Stewart (57) ABSTRACT

A CAD system includes a storage device for storing information for the types and positions of cell blocks to be disposed in an internal circuit area, prohibition of arrangement of power source lines and electrode pads, and a plurality of layout parts each including an electrode pad and a connection cell. Each of the layout parts is selected based on the distance between the electrode pad and an associated I/O cell, thereby obviating the step of wiring between the electrode pad and the I/O cell.

8 Claims, 9 Drawing Sheets

DESIGN SYSTEM FOR FLIP CHIP SEMICONDUCTOR DEVICE

BACKGROUND OF THE INVENTION

1. Field of the Invention

The present invention relates to a computed aided design (CAD) system for a flip chip semiconductor device, and more particularly to a design system which is capable of designing a flip chip semiconductor device in a smaller time length.

2. Description of the Related Art

In recent years, the higher integration levels of semiconductor chips has lead to smaller and thinner semiconductor devices. As a result, further increases in the performance and the speed of electronic equipment become possible. In addition, new packages are developed in response to the demands generated by this type of higher performance, lighter weight, and higher speed electronic equipment. One such example is the appearance of packages using flip chip systems (FCBGA: flip chip ball grid array) which enable high density packaging.

Figure 1:
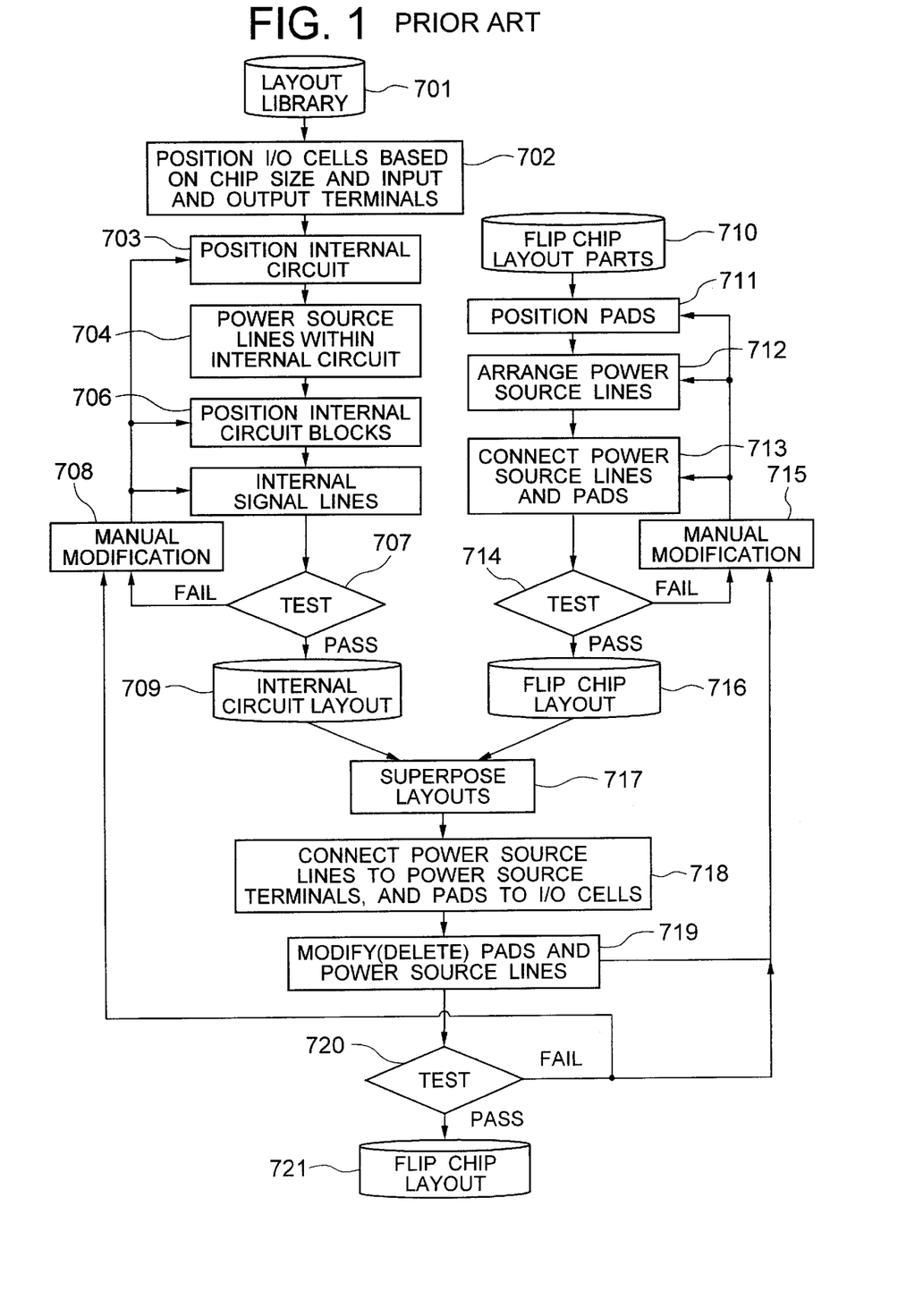
FIG. 1 is a flowchart showing a conventional design system for a flip chip semiconductor integrated circuit.

In the design and development of a flip chip semiconductor integrated circuit, computer aided design (CAD) is used for preparing the layout while various processing is executed. FIG. 1 is a flowchart showing a conventional design system for a flip chip (flip chip system) semiconductor integrated circuit. This design system includes processing for preparing a flip chip layout in advance, and processing for preparing an internal circuit layout in advance.

In the processing for preparing the flip chip layout, first, layout parts 710 for the flip chip system are prepared, and then at step 711, electrode pads (PAD) including both power source pads and signal pads are positioned using the CAD system. Subsequently, at step 712, power source lines are arranged in the internal circuit area including internal circuit blocks (internal cell blocks). Then, at step 713, connections are made between the power source lines of the internal circuit area and the power source pads, and then at step 714 the layout design is tested. If the test results are unsatisfactory then manual modifications are made at step 715, whereas if the test results are satisfactory, the layout is accepted as a flip chip layout 716.

In contrast, in the processing for preparing a layout diagram for the internal circuit, layout information, terminal information, and the like for the internal circuit are stored, in advance, in a layout library 701. Subsequently, at step 702, the necessary information is retrieved from the layout library 701, and I/O cells are positioned based on chip size and information for each of the input and output terminals.

The internal circuit is positioned at step 703, and then at step 704, power source lines are arranged within the positioned internal circuit. At step 705, internal circuit blocks are positioned for macro blocks, RAMs, internal cellc blocks, and the like, and then at step 706, signal lines are arranged within the internal circuit. At step 707, a test is performed of the circuit characteristics of the internal circuit, and if the test results are unsatisfactory then the process proceeds to step 708 where manual modifications are made. In contrast, if the test results are satisfactory, then the layout is retained as an internal circuit layout 709.

Subsequently, at step 717, the flip chip layout 716 and the internal circuit layout 709 are combined by superposition of the layout data. Then, at step 718, connections are made between the power source lines of the internal circuit area and the power source pads of each of the positioned internal circuit blocks, as well as between the signal pads and the I/O cells. After modifications are applied to either the electrode pads including the signal pads and the power source pads or the power source lines at step 719, a test of the circuit characteristics is performed at step 720. If the test results are unsatisfactory, the process jumps to either step 708 or step 715 where the corresponding modification processing is conducted. In contrast, if the test results are satisfactory, then the layout is accepted as a flip chip layout diagram 721.

As follows is a more detailed description of the modifications of step 719. For example, if a macro block including interconnect lines which are formed as the same level layer as the power source lines is positioned within the flip chip layout as an internal circuit block, then in order to prevent a short circuit failure with the power source lines, the interconnect lines require some type of modification, such as cut-off or removal of portions of some interconnect lines.

Figure 2A:
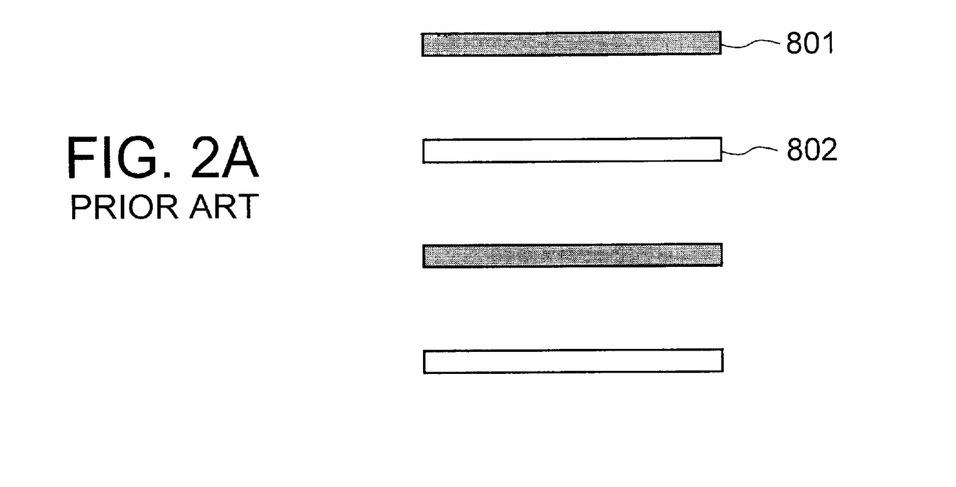
FIG. 2A shows the power source lines of the internal circuit area.
Figure 2B:
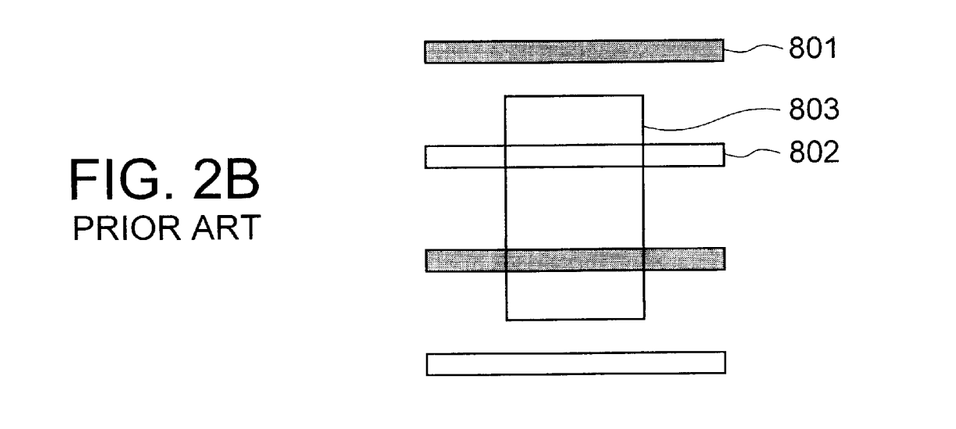
FIG. 2B shows the positioning of the power source lines and a macro block having a portion of the same layer.
Figure 2C:
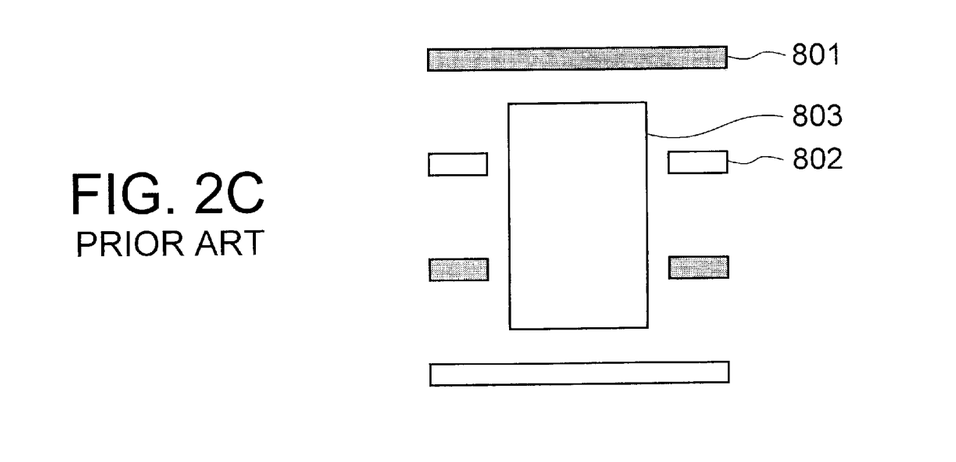
FIG. 2C shows the stage after deletion of the unnecessary sections of the power source lines.

FIGS. 2A to 2C are schematic diagrams showing processing during such a manual modification step. FIG. 2A shows arrangement of the power source lines including VDD lines 901 and GNG lines 902 in the internal circuit area, FIG. 2B shows the stage after positioning of a macro block 903 including interconnect lines having the same level with the power source lines, and FIG. 2C shows the stage after the deletion of the unnecessary portions of the power source lines. In actuality, although electrode pads would also be arranged in FIGS. 2A to 2C, they have been omitted therein for the sake of simplicity.

In FIG. 2A, a CAD system is used to alternately provide VDD lines 801 and GND lines 802, which function as the power source lines. Then, as shown in FIG. 2B, a macro block 803, a portion of which overlaps the sections of the VDD lines 801 and the GND lines 802 in the same level, is arranged in the CAD system. As shown in FIG. 2C, the sections of the VDD lines 801 and the GND lines 802 which pass through the macro block 803 are deleted manually.

Figure 3A:
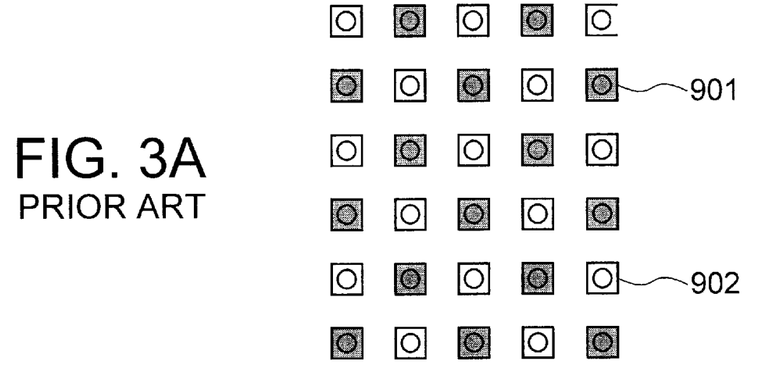
Figure 3B:
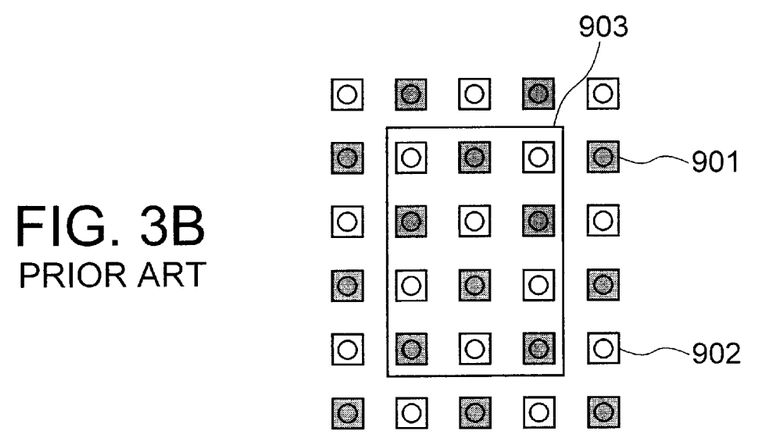
FIG. 3B shows the positioning of a RAM within the internal circuit area.
Figure 3C:
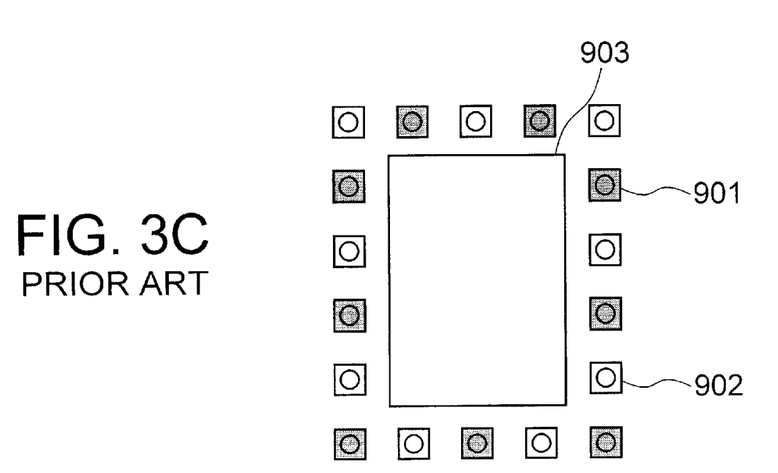
FIG. 3C shows the stage after deletion of the electrode pads overlapping with the RAM.

FIGS. 3A to 3C show another example of a conventional manual modification, wherein electrode pads are modified. FIG. 3A shows electrode pads positioned within the internal circuit area, FIG. 3B shows the stage wherein a RAM is superposed thereon, and FIG. 3C shows the stage after deletion of the electrode pads overlapping with the RAM.

In FIG. 3A, the CAD system is used to arrange VDD pads 901 and GND pads 902, which function as power source pads in the internal circuit area, alternately in a matrix. During an actual flip chip system process, assuming the case that balls (of Pb—Sn based solder, for example) which function as the external terminals are mounted onto the electrode pads, if the RAM 903 is positioned directly below the balls 901 and 902, an á ray emitted from one of the balls 901 and 902 may cause a soft error in the RAM 903. In view of this soft error, the power source pads 901 and 902 in the flip chip system are prohibited for positioning thereof directly above the RAM 903, if included in the internal circuit layout, in the layout design. Consequently, the electrode pads, such as 901 and 902, which overlap with the RAM 903 shown in FIG. 3B are deleted, as shown in FIG. 3C.

As described above, the conventional design system requires a rather complex processing, with the internal circuit layout 709 and the flip chip layout 716 being prepared separately in advance. These two layouts are then superposed, and secondary modifications are performed as required, before the testing process. Tests for design rules and the like also need to be performed individually. In particular, if the test results after the superposition of the two layout data 716 and 709 are unsatisfactory, modifications of the layout data 716 and 709 need to be performed manually, and these manual modifications must then be continued until a satisfactory test result is achieved. As a result, it takes a larger workload and a larger time length in the layout design. Furthermore, because the flip chip layout must be prepared manually for each different chip size, the development of new flip chip system requires larger volumes of data and larger number of development steps.

SUMMARY OF THE INVENTION

The present invention takes the above situation into consideration, with an object of providing a design system for a flip chip semiconductor device, which is capable of reducing the overall design time by reducing the time required for preparation, modification and testing of the design, and in particular allowing a reduction in the data volume and the number of steps required for the development of a new flip chip system.

In accordance with a computer aided design system of the present invention for designing a flip chip semiconductor device, the overall design time can be shortened by reducing the time length for designing the connection between the electrode pads and the I/O cells.

BRIEF DESCRIPTION OF THE DRAWINGS

FIGS. 2A to 2C are schematic top plan views showing the conventional manual modification for the power source lines, wherein

FIGS. 3A to 3C are top plan views showing the manual modification for electrode pads using a conventional design system, wherein 3A shows electrode pads within an internal circuit area.

FIGS. 5A to 5C are top plan views showing the layout of a semiconductor integrated circuit prepared by the design system of the first embodiment, wherein

FIGS. 6A to 6C are top plan views showing the layout of a portion of the internal circuit area of FIGS. 5A to 5C, wherein

FIGS. 7A to 7C are top plan views showing the layout of a signal pad area according to the first embodiment, wherein

FIGS. 9A to 9D are top plan views showing the layout of an internal circuit area according to a second embodiment of the present invention, wherein

DETAILED DESCRIPTION OF THE PREFERRED EMBODIMENTS

Figure 4:
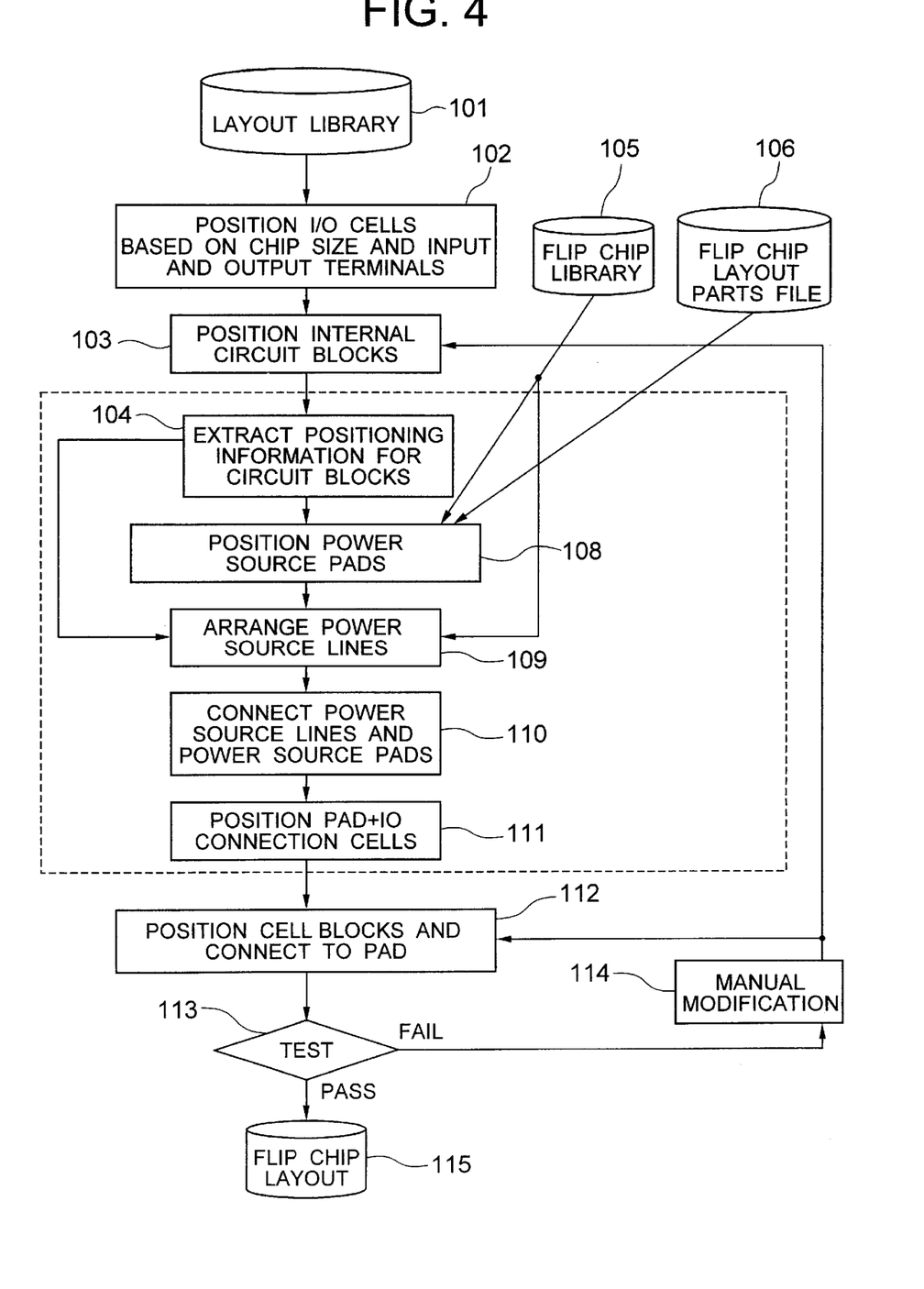
FIG. 4 is a flowchart showing a design system for a flip chip semiconductor integrated circuit according to a first embodiment of the present invention.

The present invention will be now described in detail below based on embodiments of the present invention and with reference to the accompanying drawings. FIG. 4 shows a design system for a flip chip (flip chip system) semiconductor integrated circuit according to a first embodiment of the present invention.

In the CAD system used in the design of a flip chip semiconductor integrated circuit according the first embodiment, information (a first set of information) including layout information for a predefined internal circuit, information on chip size, positioning information for electrode pads, connection information for input and output terminals, functional logic information, information relating to the location and type (such as NAND, RAM or flip flop) of positioned internal circuit blocks, and information for prohibiting the arrangement of power source lines at specified circuit blocks depending on the type of the internal circuit block, is stored in a layout library 101. Of this stored first information, the information on chip size, the information on the location of internal circuit blocks, and the connection information for the input and output terminals for the entire flip chip layout scheme, are managed as a circuit layout information. In contrast, the layout information of the internal circuit, the information on chip size, the types of internal circuit blocks, the information on input and output terminals of the internal circuit blocks, power supply information, and the information on prohibited power source lines are managed as block layout information corresponding to each internal circuit block.

Furthermore, information (a second set of information) including information on the internal circuit layout, design rule information, and information for prohibiting electrode pad positioning in certain areas depending on the type of the internal circuit block is stored in a flip chip library 105.

Moreover, information (a third set of information) on a plurality of different types of layout parts, each of which has an electrode pad and a connection section coupled to the electrode pads, is stored as a flip chip layout parts file 106. One of the layout parts is used in accordance with the position of the electrode pads.

The layout library 101, the flip chip library 105 and the flip chip layout parts file 106 are each shown as a single entity or file in the figure although in actuality a plurality of files exist in each library. These libraries and files are suited to any chip size, and are used in combination during the flip chip design process.

Figure 5A:
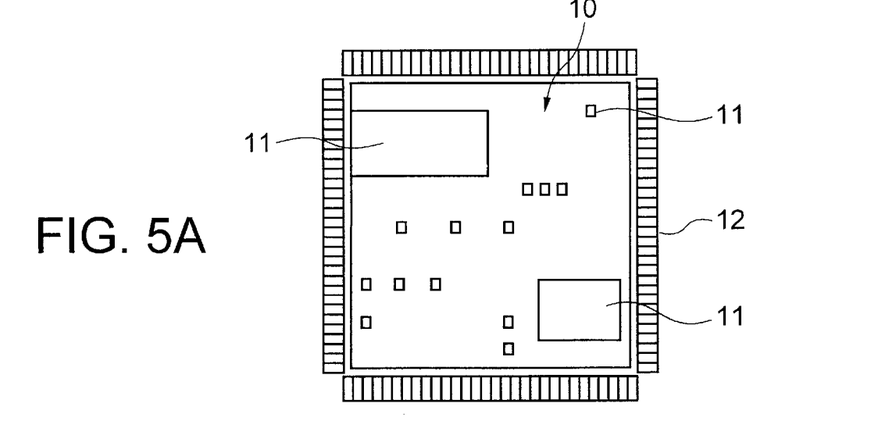
FIG. 5A shows an internal circuit layout.
Figure 5B:
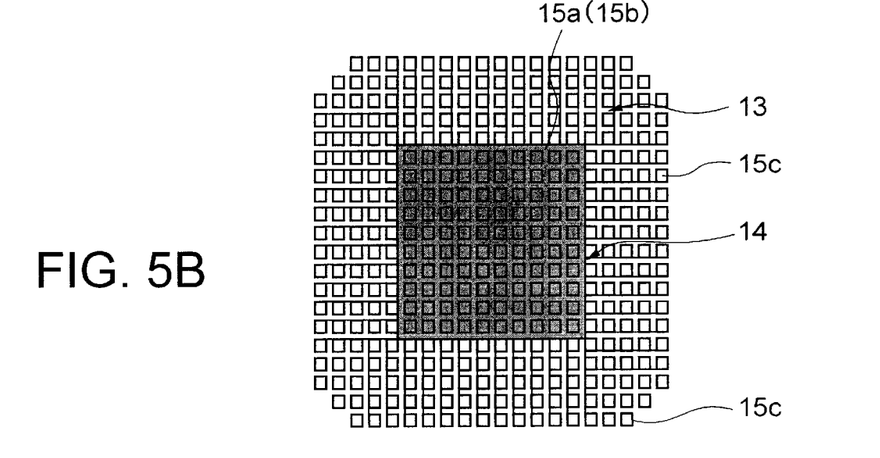
FIG. 5B shows a flip chip layout.
Figure 5C:
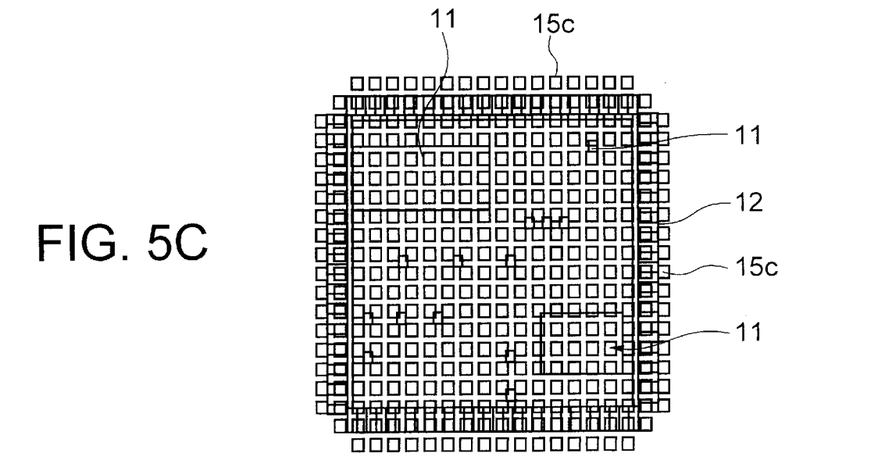
FIG. 5C shows the internal circuit layout of FIG. 3A and the flip chip layout of FIG. 3B superposed with each other.

FIGS. 5A to 5C show exemplified layouts for semiconductor integrated circuits prepared by the design system of the first embodiment. In the figures, FIG. 5A shows an internal circuit layout, FIG. 5B shows a flip chip layout, and FIG. 5C shows the internal circuit layout of FIG. 5A and the flip chip layout of FIG. 5B superposed with each other. In this description, the internal circuit blocks refer to macro blocks, RAMs, r internal cell blocks or the like made up of a circuit equipped with basic logic functions such as NAND gates, NOR gates and flip flops.

As shown in the internal circuit layout of FIG. 5A, a plurality of internal circuit blocks 11 are positioned in the internal circuit area, which is enclosed by a plurality of I/O cells 12 disposed on the outer periphery of the chip of the semiconductor integrated circuit. Each of the internal circuit blocks 11 is defined by the internal circuit layout information including information on the chip size, internal circuit positioning information, and the terminal information for the entire flip chip layout scheme.

As shown in FIG. 5B, the flip chip layout includes a plurality of electrode pads 15 arranged in a matrix, with the number of electrode pads and the pitch therebetween determined by the chip size. The area in which the electrode pads 15 are positioned can be roughly divided into a signal pad area 13 and a central area 14.

As shown in FIG. 5C, when the internal circuit layout and the flip chip layout are superposed, some internal circuit blocks 11 are located in the central area 14 and other internal circuit blocks 11 are located in the signal pad area 13. In the central area 14 are positioned GND pads 15a, VDD pads 15b and power source lines. In the signal pad area 13 are positioned a plurality of I/O cells 12, and signal pads 15c connected to respective I/O cells 12.

The following description refers back to FIG. 4 in addition to FIGS. 5A to 5C. First, at step 102, internal circuit layout information, chip size information, and information on input and output terminals is extracted from the layout library 101. Then, at step 103, based on the extracted information, the locations of the I/O cells 12 are considered, including factors such as the distance from the terminals of internal circuit blocks 11 which are to be connected, and the internal circuit blocks 11 such as macro blocks and RAM are then positioned within the internal circuit. Among the internal circuit blocks 11 are those for which electrode pads must not be positioned directly thereon, and circuits for which power source lines must be cut.

Figure 6A:
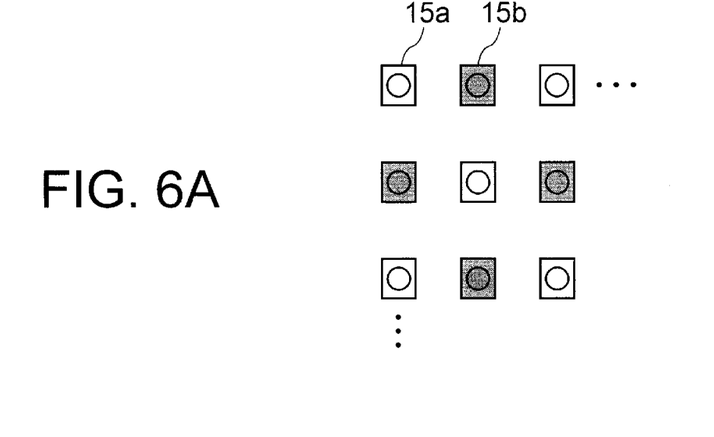
FIG. 6A shows the positioning of the electrode pads.
Figure 6B:
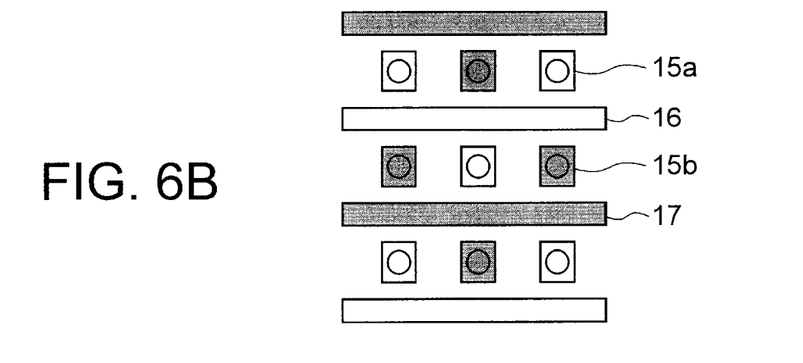
FIG. 6B shows the positioning of the power source lines.
Figure 6C:
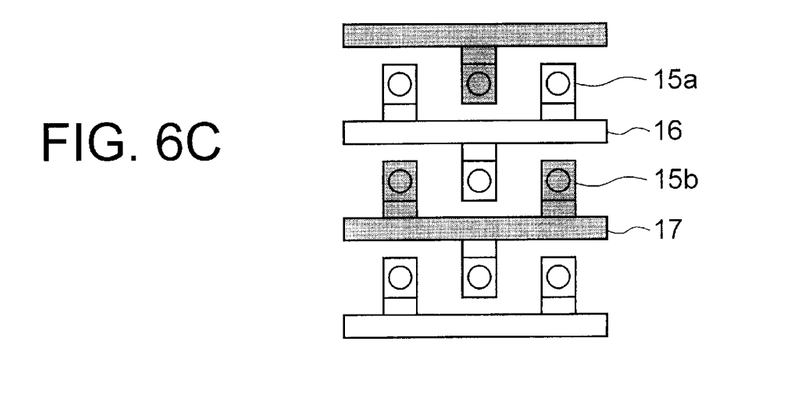
FIG. 6C shows the stage after connection of potential power source lines and corresponding electrode pads.

FIGS. 6A to 6C shows enlarged views of a portion of the layout of the central area 14 shown in FIG. 5B. FIG. 6A shows the positioning of the electrode pads, FIG. 6B additionally shows the positioning of the power source lines, and FIG. 6C shows the stage after automated connection of the power source lines and respective electrode pads. At step 104 in FIG. 4, the circuit information including the detailed type of the integrated circuit, the positioning information for the internal circuit blocks 11, and the information relating to connections to the electrode pads and the internal circuit power source is extracted from the corresponding layout library 101.

Subsequently, at step 108, based on the chip size information extracted from the layout library 101, the information on prohibited electrode pad positions extracted from the flip chip library 105, and the layout parts information extracted from the flip chip layout parts file 106, those electrode pads and interconnect lines which are necessary in preparing the flip chip layout are identified, together with those electrode pads and interconnect lines which are deemed unnecessary. Then the electrode pads, namely the GND pads 15a and the VDD pads 15b, are alternately positioned automatically in a matrix, as shown in FIG. 6A. At this stage, the overall layout is such that shown in FIG. 5B.

Subsequently, at step 109, based on the information on prohibited power source lines extracted from the layout library 101 and the design rule information extracted from the flip chip library 105, the power source lines including the GND lines 16 and the VDD lines 17 are alternately positioned between rows of the matrix of the electrode pads, as shown in FIG. 5B.

At step 110, the GND lines 16 and the VDD lines 17 are connected automatically to the corresponding GND pads 15a or VDD pads 15 depending on the desired potentials.

Figure 7A:
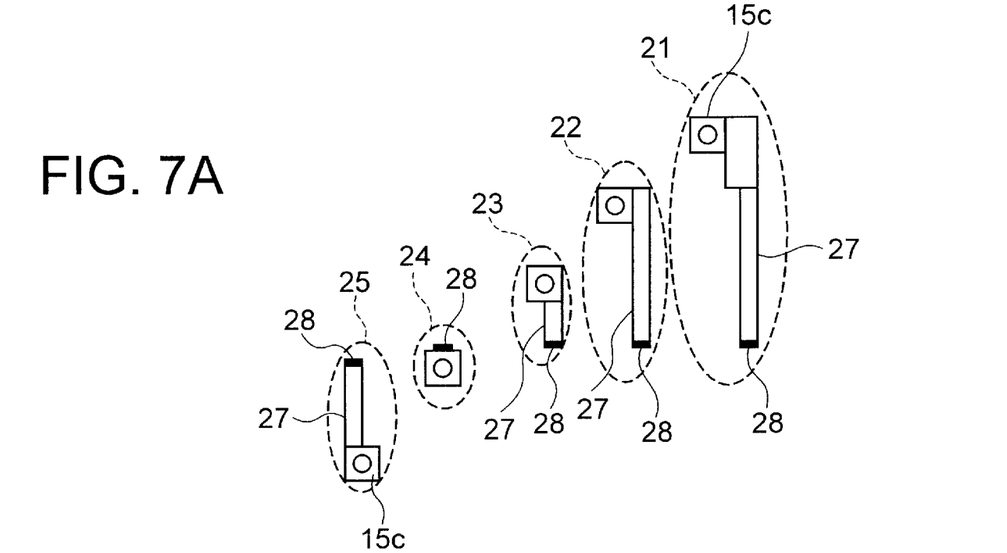
FIG. 7A shows an example of layout parts.
Figure 7B:
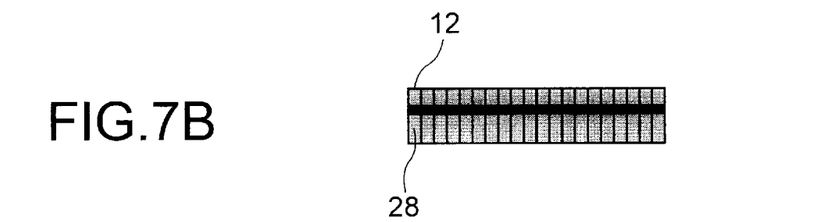
FIG. 7B shows the positioning of I/O cells.
Figure 7C:
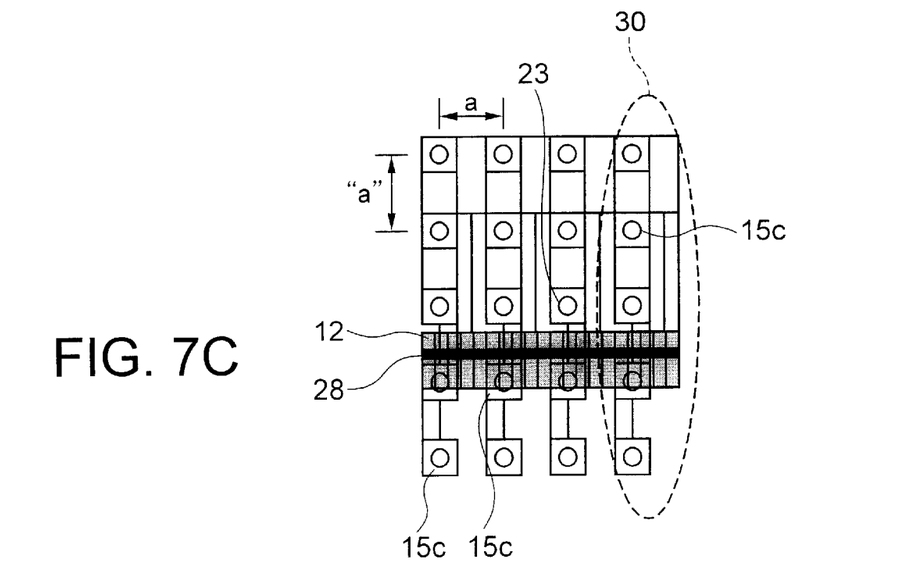
FIG. 7C shows the layout parts positioned on the I/O cells of a chip.

At step 111, a positioning/interconnection tool is used to automatically select layout parts (PAD+I/O connection cells) each including an electrode pad and a connection cell, and these cells are positioned in the signal pad area 13. FIGS. 7A to 7C show these layout parts, where FIG. 7A shows an example of PAD+I/O connection cells which function as pre-prepared layout parts, FIG. 7B shows an I/O cell area including twenty I/O cells 12 to be associated with the layout parts shown in FIG. 7A, and FIG. 7C shows the layout parts of FIG. 7A positioned on the I/O cells.

As shown in FIG. 7A, in the layout parts of the PAD+I/O connection cells, since the distance and the offset between an I/O cell 12 and an associated electrode pad is determined based on the length and the width of the I/O cell 12 (shown in FIG. 7B), layout parts files are prepared for each length and width of I/O cell 12. Each of the layout parts includes an electrode pad 15C, a connection cell 27 having a specified length and coupled to a specified position of the electrode pad 15C with respect to the center of the electrode pad 15C, and a connection section 28 attached at the distal end of the connection cell 27.

In FIG. 7A, the depicted layout parts includes five types of the parts, including: a first type having an electrode pad 15C, a connection cell extending downward from the electrode pad 15C, with an offset between the center of the electrode pad and the connection cell, and a connection section 28; a second type having an electrode pad and connection section 28 without having a connection cell 27, a third type having an electrode pad 15C, a connection cell extending upward from the electrode pad 15C by a first length with a first offset therebetween, and a connection section 28; a fourth type having an electrode pad 15C, a connection cell extending upward from the electrode pad 15C by a second length larger than the first length, with a second offset therebetween, and a connection section 28; and a fifth type having an electrode pad 15C, a connection cell 27 extending upward from the electrode pad 15C by a third length larger than the second length, with a third offset therebetween, and a connection section 28. In these configuration, the five layout parts 25 to 21 are arranged for five I/O cells 12 arranged in a I/O row.

From the layout parts files stored in the CAD system, the most suitable parts file is determined as a matter of course based on the size (width) of the I/O cells 12 to be used. Once the distance between the I/O cell 12 and the electrode pad has been decided, the length of the I/O connection cell 27 is also obtained, thereby specifying the type of the layout parts.

In the first embodiment, as described above, the layout information (I/O connection cell 27) for connecting the electrode pad and the I/O cell 12 is added in advance to the layout of the electrode pad, thereby preparing the "PAD+I/O connection cell" type parts shown in FIG. 7A. In other words, the layout information for the electrode pads and the PAD+I/O connection cells is prepared in advance in the form of flip chip layout parts. Consequently, it is possible to reduce the steps required for connecting the electrode pads and the I/O cells 12, as well as to reduce the occurrence of connection errors between the layouts.

I/O cells 12 are positioned on the internal circuit layout which has been designed to include the central area 14. On an actual chip, as shown in FIG. 7B, elongate rectangles arrayed in a single direction are each an I/O cell 12, and the connection sections 28 of the I/O cells are located in the vicinity of the center thereof. By arraying this type of I/O cell 12 sequentially in a direction, one side of the chip is determined, and the other three sides of the chip are similarly determined. In this positioning method to determine the number of I/O cells 12 to be arranged along a single side of the chip, the number of I/O cells 12 is determined based on the chip size and the number of terminals. The PAD+I/O connection cell layout parts 25 to 21 can be determined based on the width of the I/O cells 12, and thus the PAD+I/O connection cells 25, 24, 23, 22 and 21 are positioned sequentially based on a one-to-one correspondence with the respective I/O cells 12.

The pre-prepared layout parts are arranged so that a pad line having five types of layout parts 25 to 21 can be formed immediately from the files and connected to respective I/O cells 12. With such arrangement, the length and shape of the I/O connection cells 27 should be such that the pitch between electrode pads is uniform. Furthermore, the pad pitch between the adjacent pad rows is equal to the pitch of the adjacent pads within each pad row, and accordingly, the pads are arrayed with an equal pitch both horizontally and vertically.

As shown in FIG. 7C, five layout parts 25 to 21 of FIG. 5A are arranged in a single row corresponding to five adjacent I/O cells 12 of FIG. 7B. In this state, the connection section 28 of the layout parts 25 to 21 is connected to the connection sections 28 of the respective I/O cells 12, based on a one-to-one correspondence. The layout parts are selected from the file for arrangement in a sequence of layout parts 25, 24, 23, 22 and 21 for each five of the I/O cells. In other words, by positioning the layout parts shown in FIG. 7A on the I/O cells of FIG. 7B, a 5×4 array of electrode pads can be obtained as shown in FIG. 7C. It is to be noted that, if the chip size is changed, then the number of I/O cells 12 to be arranged is also changed, resulting in selection of another series of layout parts.

In consideration of the pad pitch and the I/O cell width, assuming that the width of the I/O cell 12 is 50 μm, for example, alignment of five such I/O cells produces a width of 250 μm. If the pad pitch should be set at 250 μm, then a pad row including five pads conforms to the arrangement of the I/O cells 12, as shown in FIG. 7C. In other words, if a pad row includes four pads, then the numbers of I/O cells and pads within a single pad pitch would not match. A suitable selection can be made for the number of I/O cells and the number of layout parts arranged in a row depending on the width of the I/O cells and the allowable pitch of the electrode pads.

In the manner as described above, at step 111, the signal pad area 13 of the flip chip layout is completed by appropriate positioning of the layout parts 25 to 21 used for connecting the signal pads 15c and the I/O cells 12. At this stage, the PAD+I/O connection cells are positioned automatically based on the I/O cells 12 and the chip size. In the design system of this embodiment, there is a requirement that the layout parts 21 to 25 are arranged in a descending order such as 25, 24, 23 . . . with the sequence repeated until the required number of parts are positioned. As a result, the layout parts can be laid out sequentially regardless of the number of I/O cells 12, and thus the signal pad area 13 can be created automatically with superior results.

At step 112, connection is made between the positioned internal circuit blocks 11 and the electrode pads such as 15a and 15b. The spacing and location of the internal circuit blocks 11 must conform to the previously laid power source lines, and consequently the location of the blocks is confirmed last. Subsequently, the signal nodes of the internal circuit blocks 11 and the corresponding signal pads are connected with signal lines. In this manner, a flip chip layout diagram is created which includes an "internal circuit layout including macro blocks, RAM, internal cell blocks and I/O cells", and a "flip chip layout which is roughly divided into an central area 14 provided with signal pads and power source lines, and a signal pad area 13 provided with PAD+ I/O connection cells".

Figure 8:
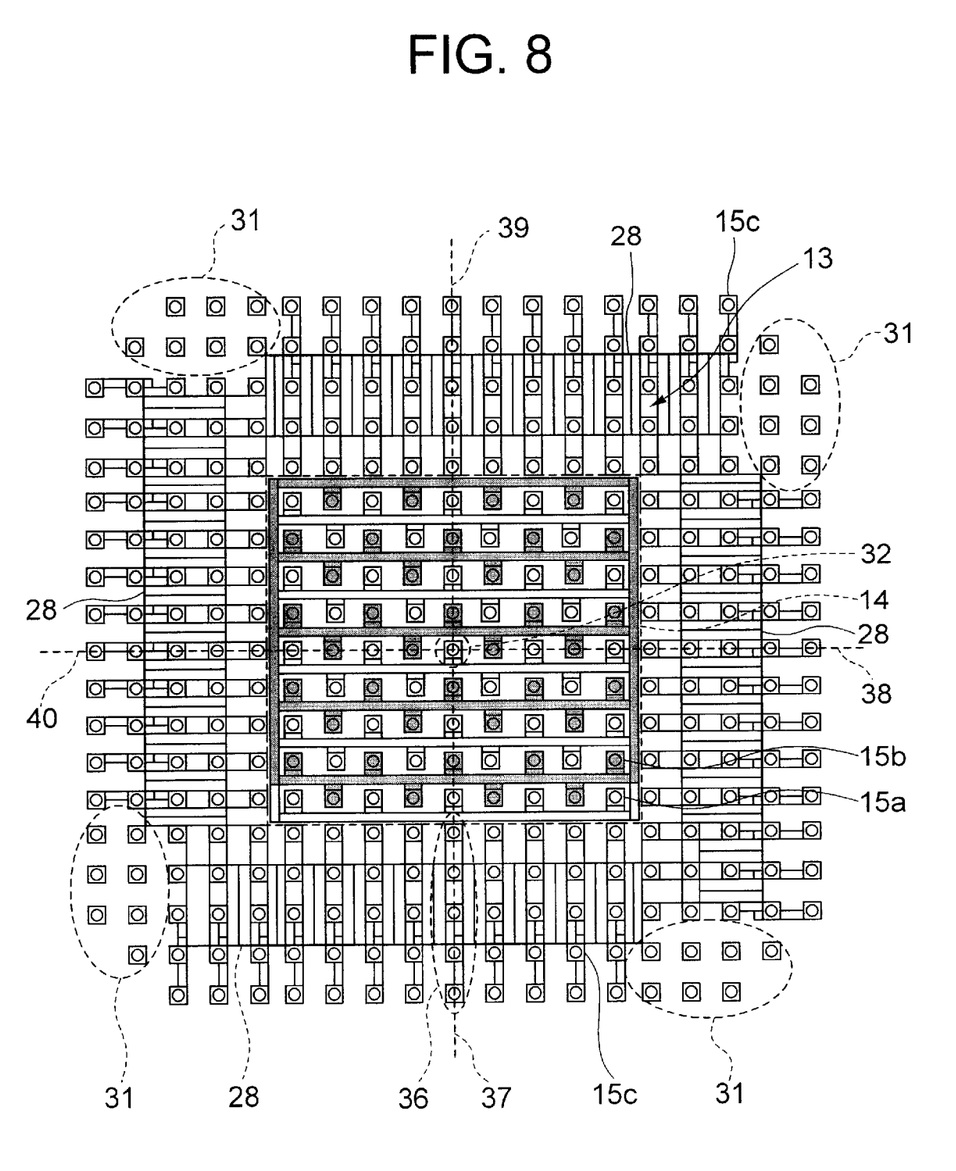
FIG. 8 is an enlarged top plan view of the flip chip layout obtained by the design system according to the first embodiment.

Details of the flip chip layout obtained by the first embodiment of the present invention are shown in FIG. 8. The drawing of the flip chip layout depicts a central area 14 positioned at a chip center 32 and including VDD pads 15b and GND pads 15a positioned around the chip center 32, and a signal pad area 13 having signal pads 15c positioned around the periphery of the central area 14. Reference numerals 37 to 40 represent central lines each passing the center of a corresponding side of the substantially rectangular signal pad area 13. A non-row pad section 31 is first arranged in the vicinity of each corner of the signal pad area 13, and pad rows 36 are then positioned beginning from the central line 37 toward both the periphery of the chip. A row of connection sections 28 between the I/O terminals and the electrode pads is positioned between each side of the signal pad area 13 and the outer periphery of the chip. By using the layout parts shown in FIG. 7A, the arrangement of the electrode pads are conducted automatically.

Another processing method for the aforementioned steps 108 to 111 will be described below with reference to FIG. 8. First, at step 108, after positioning of a GND pad 15a at the chip center 32, VDD pads 15b and GND pads 15a are positioned alternately towards the outer periphery of the chip. In consideration of the dimensions of the chip which is not square, each pad area is classified as belonging to one of four areas, namely top left, bottom left, top right or bottom right, relative to the chip center 32, and is then calculated for the each area using the following formula (1).

$$\text{Pad area}=\text{pad pitch}\times(N-1) \qquad (1)$$

In the formula (1), N is a variable which assumes a positive number such as 1, 2, 3 . . . and is determined by the following formula (2).

$$N=\{(\text{side length of each area}-A)\div\text{pad pitch}\}+1 \qquad (2)$$

In the equation (2), "A" denotes the distance between the wafer scribe line and the outermost pads at the time of chip design.

Using equation (1) and equation (2), the pad locations are calculated, and the electrode pads, including both the VDD pads 15b and the GND pads 15a, are positioned. At this stage, the outermost electrode pad is determined as a (pad line +1)th pad from the chip edge. In other words, if a pad row 36 includes five electrode pads, the electrode pads are positioned to a location of sixth pad counted from the chip edge. The pad row is formed by sequential combination of the PAD+I/O connection cells 25 to 21 shown in FIG. 7A to form a single row, and is similar to the configuration of the PAD+I/O connection cell row 30 shown in FIG. 7C.

By storing information in the flip chip library 105 relating to whether an electrode pad 15 is used as a VDD pad or a GND pad, a determination can be made as to which power source line (VDD line or GND line) should be connected. Consequently, after completion of arrangement of the power source lines at step 109, at step 110, connections are made automatically between electrode pads and the corresponding lines, which are equi-potential. In this manner, the layout parts 25 to 21 are positioned on the internal circuit blocks 11, thereby configuring the central area 14 of the flip chip layout area.

Furthermore, pad rows are positioned on all four sides of the chip, although processing is set in place so that at the time of positioning, the positioning of the pad rows commences at the center (37 to 40) of each side. In other words, as shown in FIG. 8, a central pad row 36 is first positioned in each of the cents 37, 38, 39, 40 of each side of the chip. Subsequently, other pad rows are sequentially positioned to the left and right of this central pad row 36 for each side of the chip. This process is repeated until the location where overlap occurs between a horizontal pad row and an adjacent vertical pad row. The non-row pad sections 31 are then constructed in accordance with the specifications of the flip chip layout scheme by selecting suitable PAD+I/O connection cells. If suitable PAD+I/O connection cells are selected, then these PAD+I/O connection cells are sequentially positioned up to the outermost location on each side until the each side is unable to receive an additional electrode pad. The signal pad area 13 is prepared in this manner.

Subsequently, at step 113, tests such as a design rule check (DRC) and a conformability check (LVS) between the layout and the circuit connection information are carried out. If the test results are satisfactory, the result of the layout is accepted as the flip chip layout diagram 115. In contrast, if the test results are unsatisfactory, the process passes through the manual modification stage of step 114, and the layout of the unsatisfactory areas of the internal circuit are modified. Because the CAD process of the design system of this embodiment uses the layout parts 25 to 21, which are positioned sequentially in accordance with predetermined rules, the flip chip layout diagram can be obtained by modifying only the internal circuit layout.

Conventionally, electrode pads had only layout information, and the pads were positioned manually, with the flip chip layout diagram created by connecting the power source lines and the I/O cells. In contrast, in the design system of the first embodiment, by preparing the electrode pads and PAD+I/O connection cells in advance as layout parts, and providing power supply information in advance, the combination of these layout parts enables the automatic design of flip chip layout corresponding to a variety of chip sizes.

Figure 9A:
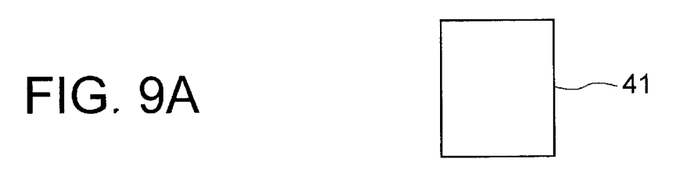
FIG. 9A shows the positioning of an analog macro block with a dedicated power supply source.
Figure 9B:
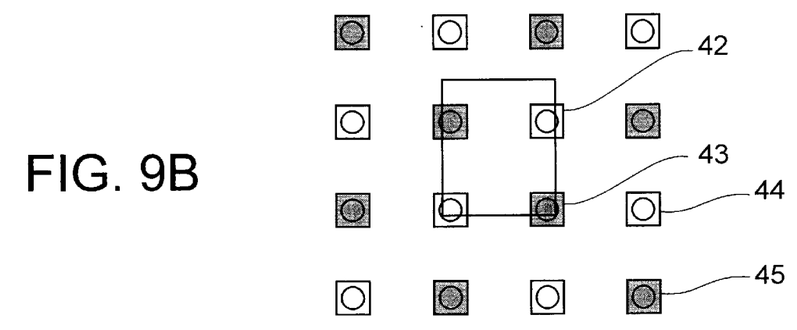
FIG. 9B shows the positioning of dedicated electrode pads.

Next, a second embodiment of the present invention will be described with reference to FIGS. 9A to 9D. FIG. 9A shows an analog macro block which operates on a dedicated power supply, FIG. 9B shows the stage after automated positioning of dedicated electrode pads for the analog macro block, FIG. 9C shows the stage after the layout of power source lines, and FIG. 9D shows the stage after an automated connection.

The second embodiment is directed to a design system wherein if the information on the positioning, type and size of the internal circuit includes information for a macro block (for example, an analog macro block in this case) which operates on a power source from a dedicated power source line having a potential different from the potential of the power source line for the internal circuit area, the existence of this macro block is identified promptly, and positioning and wiring which takes account of the information is performed automatically. The basic processing of the design system of the second embodiment is similar to that of the first embodiment, although the processing of step 104, and steps 108 to 110 are different from those in the first embodiment.

First, an analog macro block 41 as shown in FIG. 9A is positioned in the central area 14 (refer to FIG. 5B). Then, based on the chip size information extracted from the layout library 101, the information on prohibited electrode pad positions extracted from the flip chip library 105, and the layout parts information extracted from the flip chip layout parts file 106, the existence of the analog macro block 41 requiring a different power supply is identified. Subsequently, the necessary electrode pads and source lines are determined, together with those electrode pads and source lines which are deemed unnecessary. Based on this information, GND pads 44 and VDD pads 45 are alternately arranged automatically in a matrix, and a dedicated GND pad 42 and a dedicated VDD pad 43 are positioned automatically at the suitable positions, as shown in FIG. 9B.

Figure 9C:
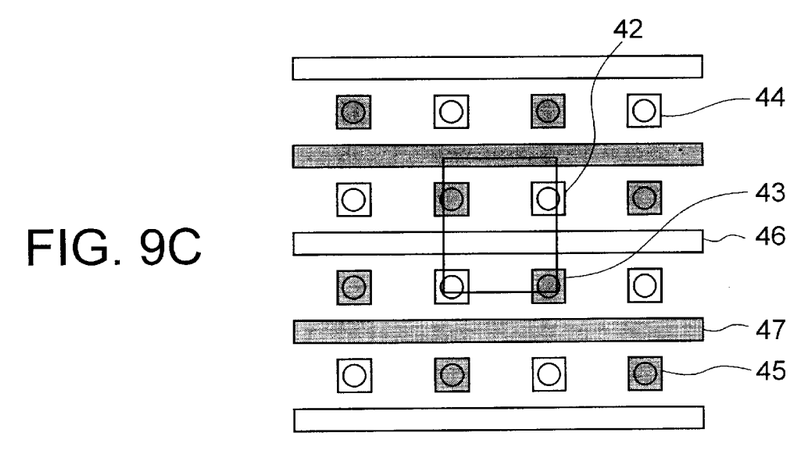
FIG. 9C shows the stage after the arrangement of power source lines.
Figure 9D:
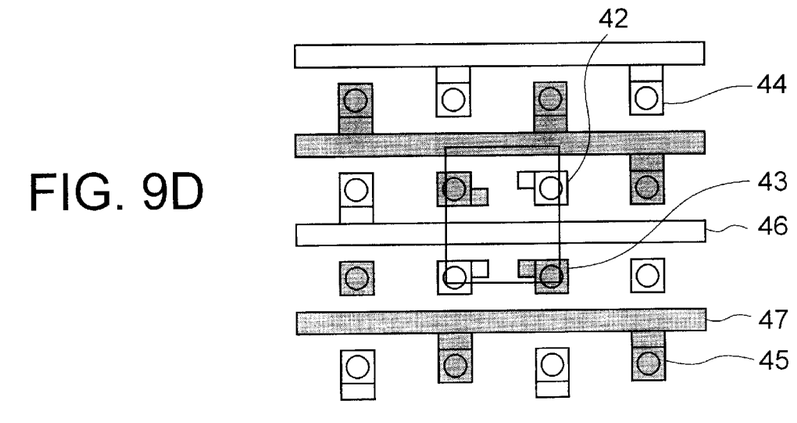
FIG. 9D shows the stage after automatic connection of each section of lines.

Subsequently, based on the information on prohibited power source lines extracted from the layout library 101 and the design rule information extracted from the flip chip library 105, GND lines 46 and VDD lines 47 are alternately positioned between rows of the matrix, as shown in FIG. 9C. Moreover, as shown in FIG. 9D, automated connections are then made between the power source lines of the analog macro block 41 and the dedicated electrode pads 42 and 43, between the VDD pads 45 and the VDD lines 47, and between the GND pads 44 and the GND lines 46.

In the second embodiment, electrode pad positioning in the internal circuit area is performed after acquisition of the positioning information and power supply information for the internal circuit. Each electrode pad has associated VDD or GND power supply information, and based on this power supply information, equipotential pads and lines are identified, and connections are made automatically between such equipotential electrode pads and power source lines. According to this design system, if a macro block has dedicated power supply information, dedicated electrode pads can be prepared and positioned automatically, and connections can be made automatically between the macro block and the dedicated electrode pads.

As described above, according to the first and second embodiments of the present invention, by adding power supply information, circuit information, and the like to the libraries for the internal circuit, the electrode pads, and the like, an optimum flip chip layout can be prepared automatically. Moreover, if the test results are unsatisfactory, the flip chip layout can be modified automatically by altering only the positioning of the internal circuit, and consequently the number of steps required for the design process can be reduced significantly in comparison with conventional design systems. More specifically, the conventional design of a 15 mm square chip, including preparation, modification and testing of the layout, has required five days work, whereas a similar design can be completed in one day with the embodiment of the present invention. Furthermore, because the design is automatic, design mistakes resulting from human error can be reduced.

Furthermore, whereas in conventional design systems flip chip layout diagrams needed to be prepared for each chip size, which requires a large volume of data, in the first and second embodiments, a common flip chip layout part file 106 is prepared in advance, and by providing the libraries with information such as power supply information and information on the type and size of the circuit, the parts can be positioned and interconnected automatically, thereby enabling the automatic preparation of the flip chip layout diagram. As a result, a layout diagram is not required for each different chip size, and a flip chip of any desired chip size can be designed based on the small amount of data describing the layout parts, thereby reducing the amount of data which must be stored.

In addition, with the first and second embodiments, in the design of the signal pad area of the flip chip layout diagram, by adding the layout of the "I/O connection cells" which connect the signal pads and the I/O cells, to the layout for the electrode pads in advance, and preparing "PAD+I/O connection cells", the number of steps required for connecting the electrode pads and the I/O cells can be reduced, as can the number of connection mistakes in mutually connecting the layouts.

While the present invention has been described above based on what are at present considered preferred embodiments, it will be understood that the design system for a flip chip semiconductor device of the present invention is not limited to the above embodiments, and also covers design systems for flip chip semiconductor devices based on various modifications and alterations of the configurations of the embodiments described above.

Since the above embodiments are described only for examples, the present invention is not limited to the above embodiments and various modifications or alterations can be easily made therefrom by those skilled in the art without departing from the scope of the present invention.

What is claimed is:

1. A computer aided design (CAD) system for designing a layout of a flip chip semiconductor integrated circuit comprising:

a first storage section for storing first information including information for locations and types of circuit blocks in an internal circuit, and information for prohibition of arrangement of interconnect lines which depends on said type of said circuit block concerned;

a second storage section for storing second information including design rule information and information for prohibition of arrangement of electrode pads which depends on said types of said circuit block concerned;

a third storage section for storing third information including information for a plurality of layout parts to be arranged, each of said layout parts including an electrode pad and an associated connection cell having a specified length; and a layout/wiring design section for performing design arrangement and wiring of at least one circuit block and a plurality of said layout parts in an internal circuit based on said first through third information.

2. The CAD system as defined in claim 1, wherein said layout/arrangement section designs for arrangement of said internal circuit based on said first information, arrangement of said electrode pads based on said second information, arrangement of interconnect lines between said internal circuit and said electrode pads based on said first and second information, and arrangement of said layout parts based on said third information.

3. The CAD system as defined in claim 2, further comprising a test section for testing a design obtained by said layout/wiring section based on at least a design rule for said internal circuit block.

4. The CAD system as defined in claim 1, wherein said first information includes chip size information.

5. The CAD system as defined in claim 1, wherein said layout/wiring section judges a macro block as one of said types of said internal circuit block, said judgement including whether or not said macro block operates on a power source different from a power source of another internal circuit block.

6. The CAD system as defined in claim 5, wherein said CAD system designs for arrangement of electrode pads for said macro block.

7. The CAD system as defined in claim 1, wherein each of said layout parts includes an electrode pad, a connection cell extending from said electrode pad, and a connection section formed at one of ends of said connection cell, said connection cells have different lengths, and a difference between said lengths of said connection cells corresponds to a pitch of said electrode pads to be arranged.

8. The CAD system as defined in claim 7, wherein said connection cell has an offset between a center of said connection cell and a center of said electrode pad, said offset being an integral multiple of a pitch of I/O cells.

* * * * *